US012757382B2

(12) United States Patent
Greenlee et al.

(10) Patent No.: US 12,757,382 B2
(45) Date of Patent: Oct. 6, 2026

(54) MEMORY CIRCUITRY AND METHODS USED IN FORMING MEMORY CIRCUITRY

(71) Applicant: Micron Technology, Inc., Boise, ID (US)

(72) Inventors: Jordan D. Greenlee, Nampa, ID (US); Ying Rui, Meridian, ID (US); Silvia Borsari, Boise, ID (US); Prashant Raghu, Boise, ID (US); Elisabeth Barr, Boise, ID (US); Yen Ting Lin, Boise, ID (US); Albert P. Chan, Boise, ID (US); Martin Chen, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 384 days.

(21) Appl. No.: 18/527,091

(22) Filed: Dec. 1, 2023

(65) Prior Publication Data

US 2024/0224505 A1 Jul. 4, 2024

Related U.S. Application Data

(60) Provisional application No. 63/437,027, filed on Jan. 4, 2023.

(51) Int. Cl.
*H10B 12/00* (2023.01)

(52) U.S. Cl.
CPC ......... *H10B 12/33* (2023.02); *H10B 12/0335* (2023.02); *H10B 12/05* (2023.02); *H10B 12/482* (2023.02)

(58) Field of Classification Search
CPC .... H10B 12/33; H10B 12/0335; H10B 12/05; H10B 12/482; H10B 12/315; H10B 12/488
See application file for complete search history.

(56) References Cited

U.S. PATENT DOCUMENTS

| | | | | |
|---|---|---|---|---|
| 9,754,946 | B1 * | 9/2017 | Yang | H10B 12/482 |
| 10,607,996 | B1 * | 3/2020 | Sasaki | H10B 12/34 |

(Continued)

*Primary Examiner* — Jonathan Han

(74) *Attorney, Agent, or Firm* — Wells St. John P.S.

(57) ABSTRACT

A method used in forming memory circuitry comprises forming transistors individually comprising one source/drain region and another source/drain region. A channel region is between the one and the another source/drain regions. A conductive gate is operatively proximate the channel region. Digitline structures are formed that are individually directly electrically coupled to the another source/drain regions of multiple of the transistors. The digitline structures individually comprise a conductive digitline and an insulator material thereatop. The insulator material has a top. First insulating material is formed directly above the tops of the insulator material and laterally-over longitudinal sides of the digitline structures and covers across the one source/drain regions laterally-between immediately-adjacent of the digitline structures. Second insulating material is formed over the first insulating material. The second insulating material has a maximum vertical thickness directly above the digitline structures that is greater than its minimum lateral thickness over the longitudinal sides of the digitline structures. The first insulating material is etched through to expose the one source/drain regions. Storage elements are formed that are individually electrically coupled to individual of the one source/drain regions. Other embodiments, including structure, are disclosed.

18 Claims, 18 Drawing Sheets

(56) References Cited

U.S. PATENT DOCUMENTS

| | | | | |
|---|---|---|---|---|
| 2020/0286893 | A1* | 9/2020 | Simsek-Ege | H10B 12/34 |
| 2021/0183865 | A1* | 6/2021 | Neelapala | H10B 12/053 |

* cited by examiner

MEMORY CIRCUITRY AND METHODS USED IN FORMING MEMORY CIRCUITRY

TECHNICAL FIELD

Embodiments disclosed herein pertain to memory circuitry and to methods used in forming memory circuitry.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The digitlines may conductively interconnect memory cells along columns of the array, and the access lines may conductively interconnect memory cells along rows of the array. Each memory cell may be uniquely addressed through the combination of a digitline and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A capacitor is one type of electronic component that may be used in a memory cell. A capacitor has two electrical conductors separated by electrically insulating material. Energy as an electric field may be electrostatically stored within such material. Depending on composition of the insulator material, that stored field will be volatile or non-volatile. For example, a capacitor insulator material including only $SiO_2$ will be volatile. One type of non-volatile capacitor is a ferroelectric capacitor which has ferroelectric material as at least part of the insulating material. Ferroelectric materials are characterized by having two stable polarized states and thereby can comprise programmable material of a capacitor and/or memory cell. The polarization state of the ferroelectric material can be changed by application of suitable programming voltages and remains after removal of the programming voltage (at least for a time). Each polarization state has a different charge-stored capacitance from the other, and which ideally can be used to write (i.e., store) and read a memory state without reversing the polarization state until such is desired to be reversed. Less desirable, in some memory having ferroelectric capacitors the act of reading the memory state can reverse the polarization. Accordingly, upon determining the polarization state, a re-write of the memory cell is conducted to put the memory cell into the pre-read state immediately after its determination. Regardless, a memory cell incorporating a ferroelectric capacitor ideally is non-volatile due to the bi-stable characteristics of the ferroelectric material that forms a part of the capacitor. Other programmable materials may be used as a capacitor insulator to render capacitors non-volatile.

A field effect transistor is another type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate. Regardless, the gate insulator may be programmable, for example being ferroelectric.

BRIEF DESCRIPTION OF THE DRAWINGS

FIGS. 6-18 are diagrammatic sequential sectional views of the construction of FIGS. 1-7 in subsequent processing in accordance with some embodiments of the invention.

DETAILED DESCRIPTION OF EXAMPLE EMBODIMENTS

Figure 1:
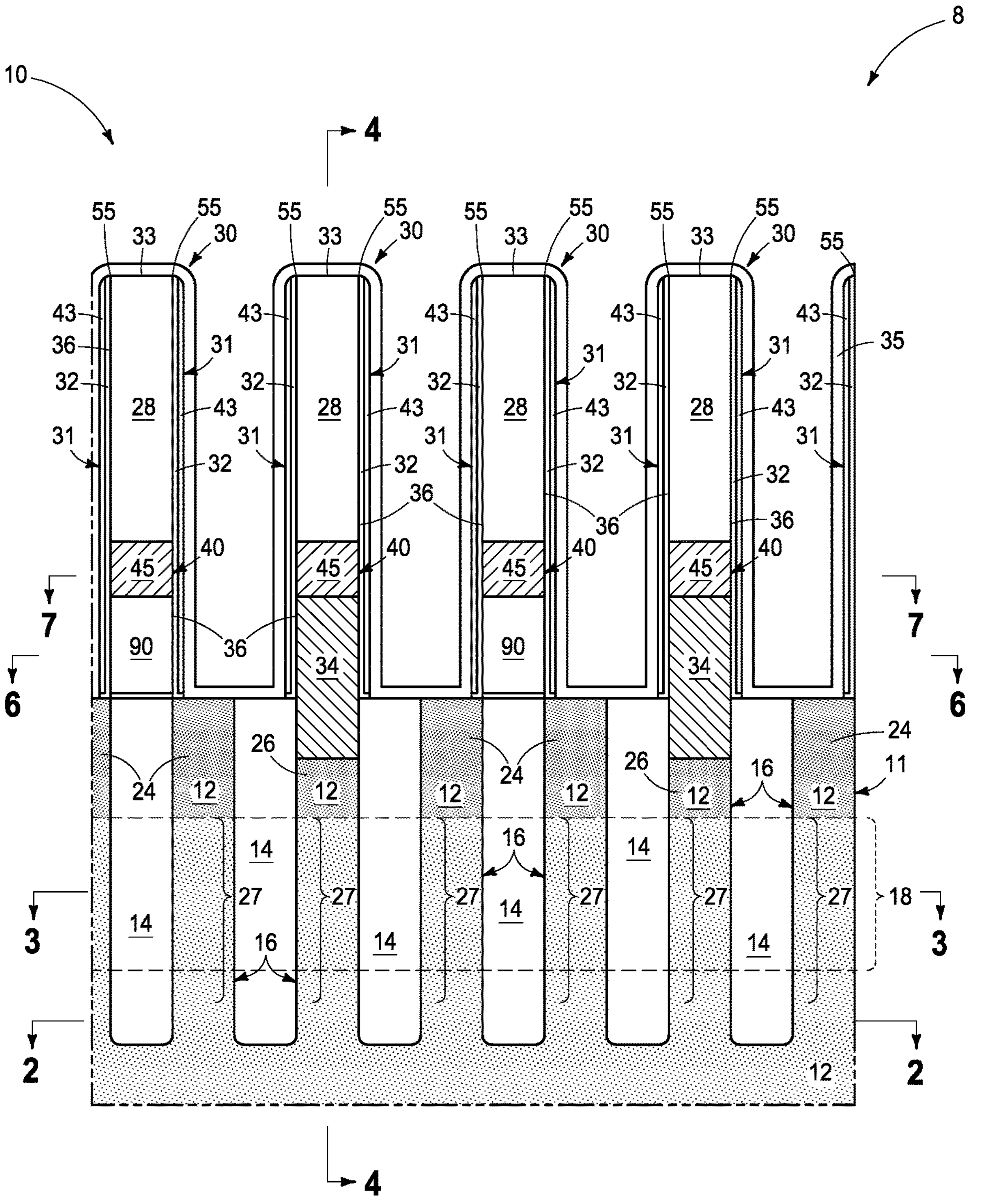
FIGS. 1-7 are diagrammatic cross-sectional views of a portion of a DRAM construction in fabrication in accordance with some embodiments of the invention.
Figure 2:
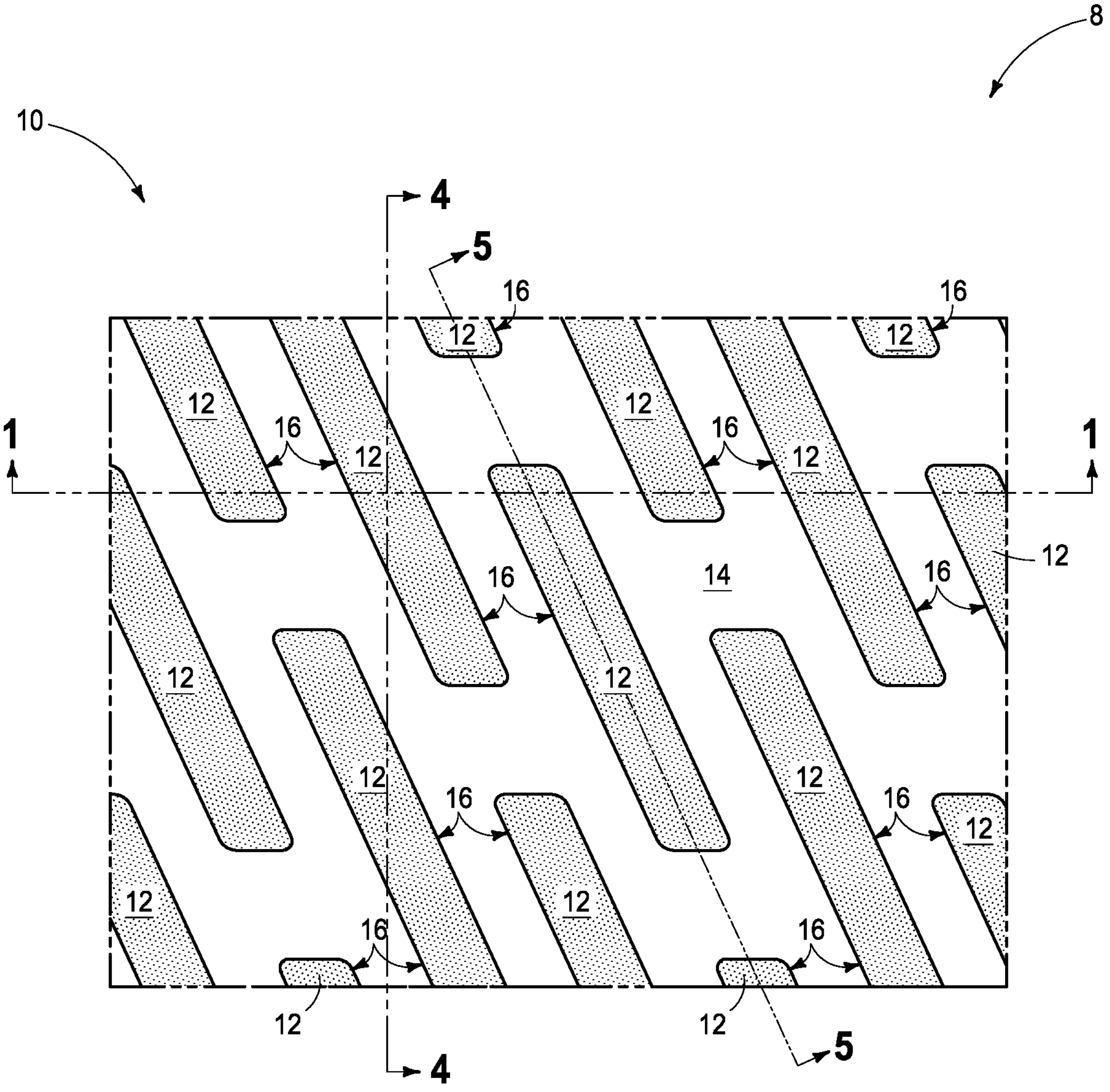
Figure 3:
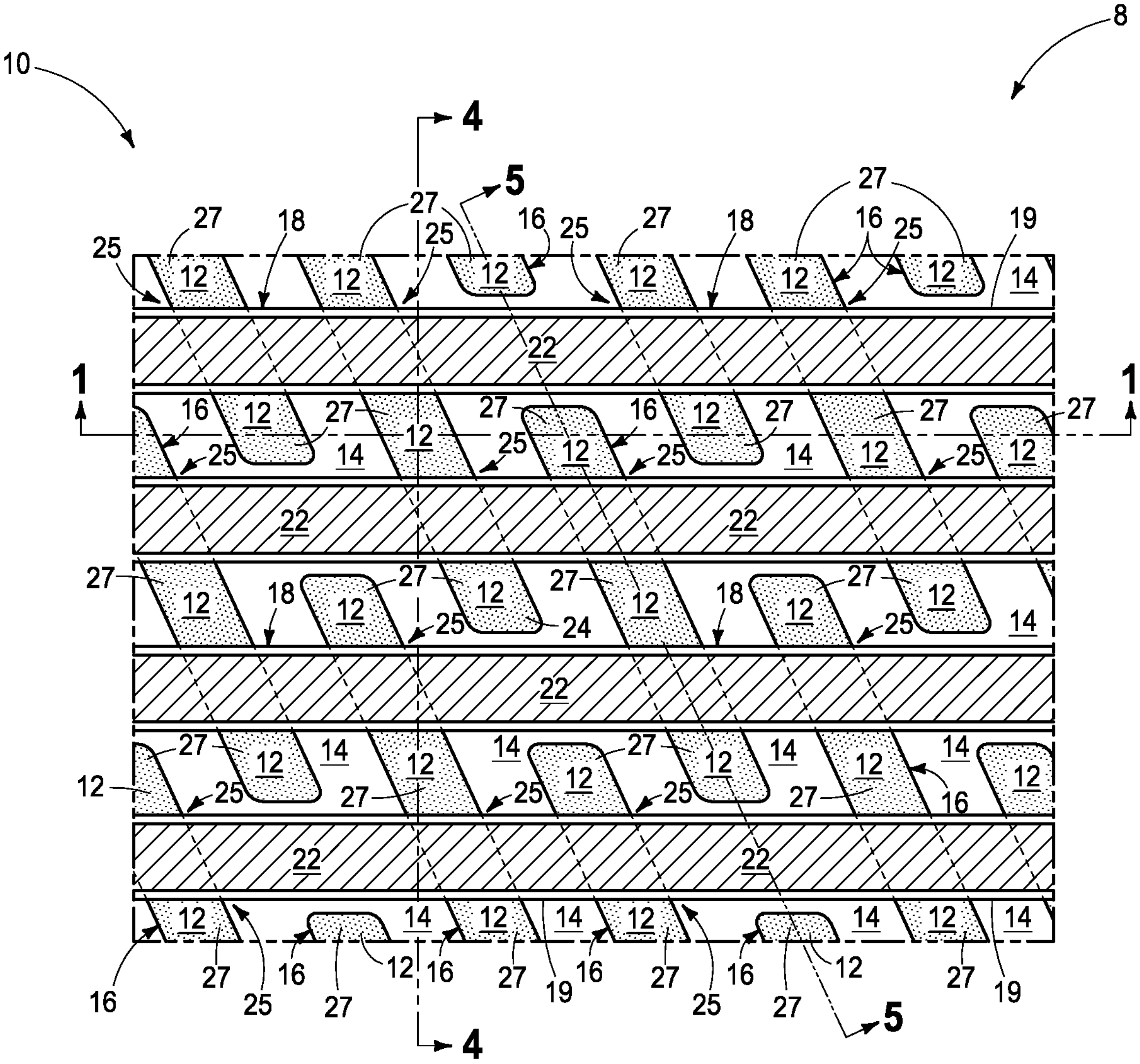
Figure 4:
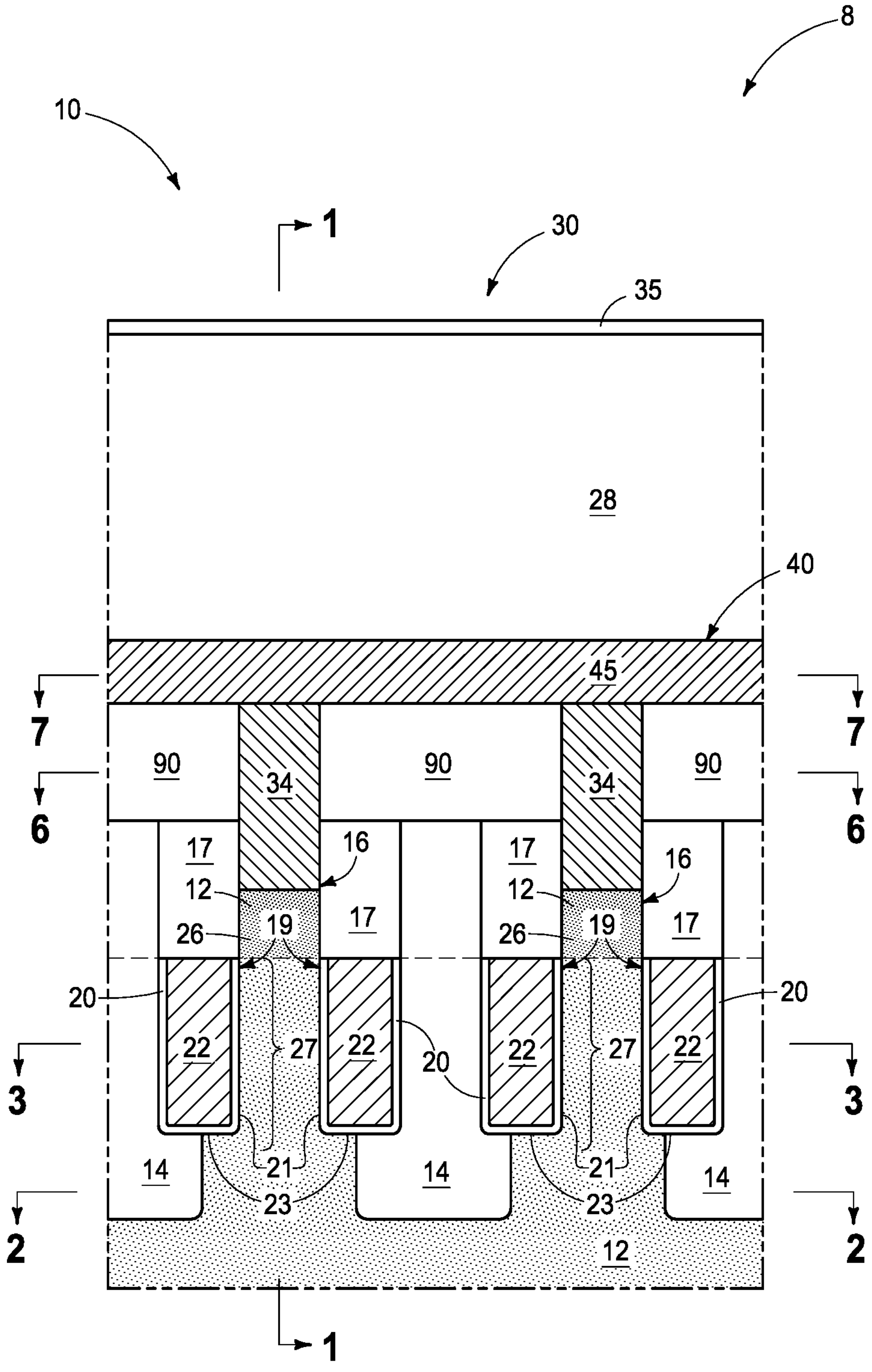
Figure 5:
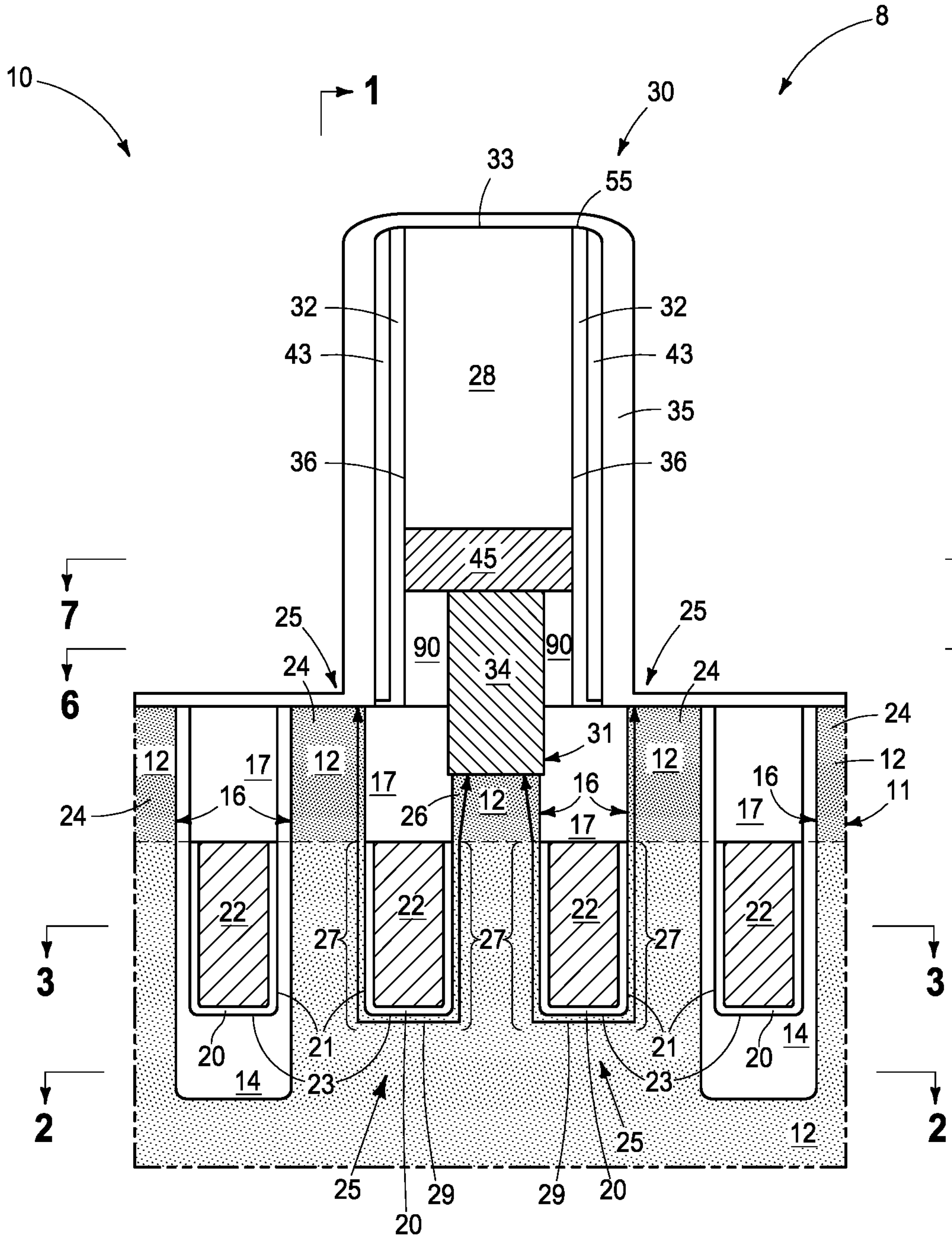
Figure 6:
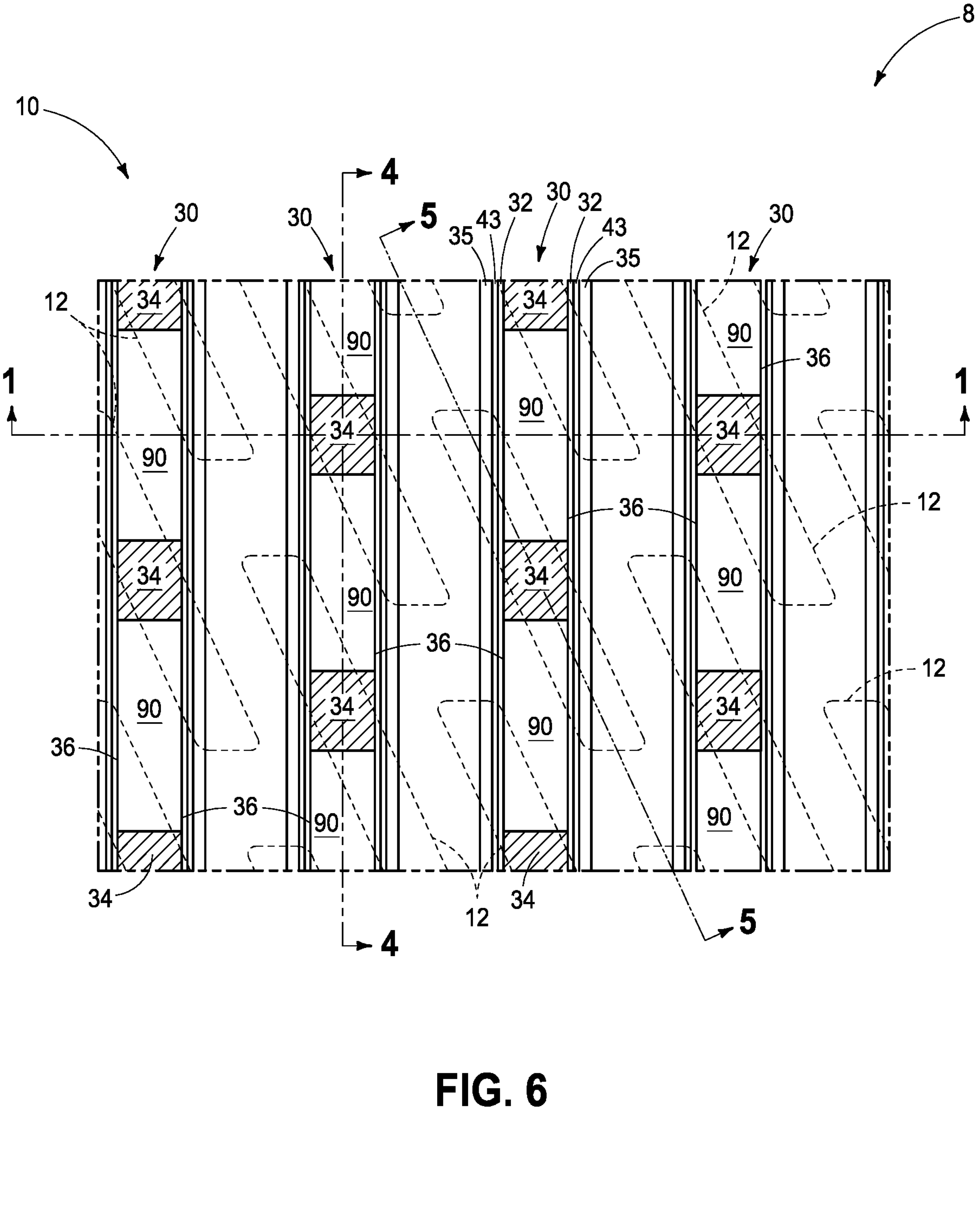
Figure 7:
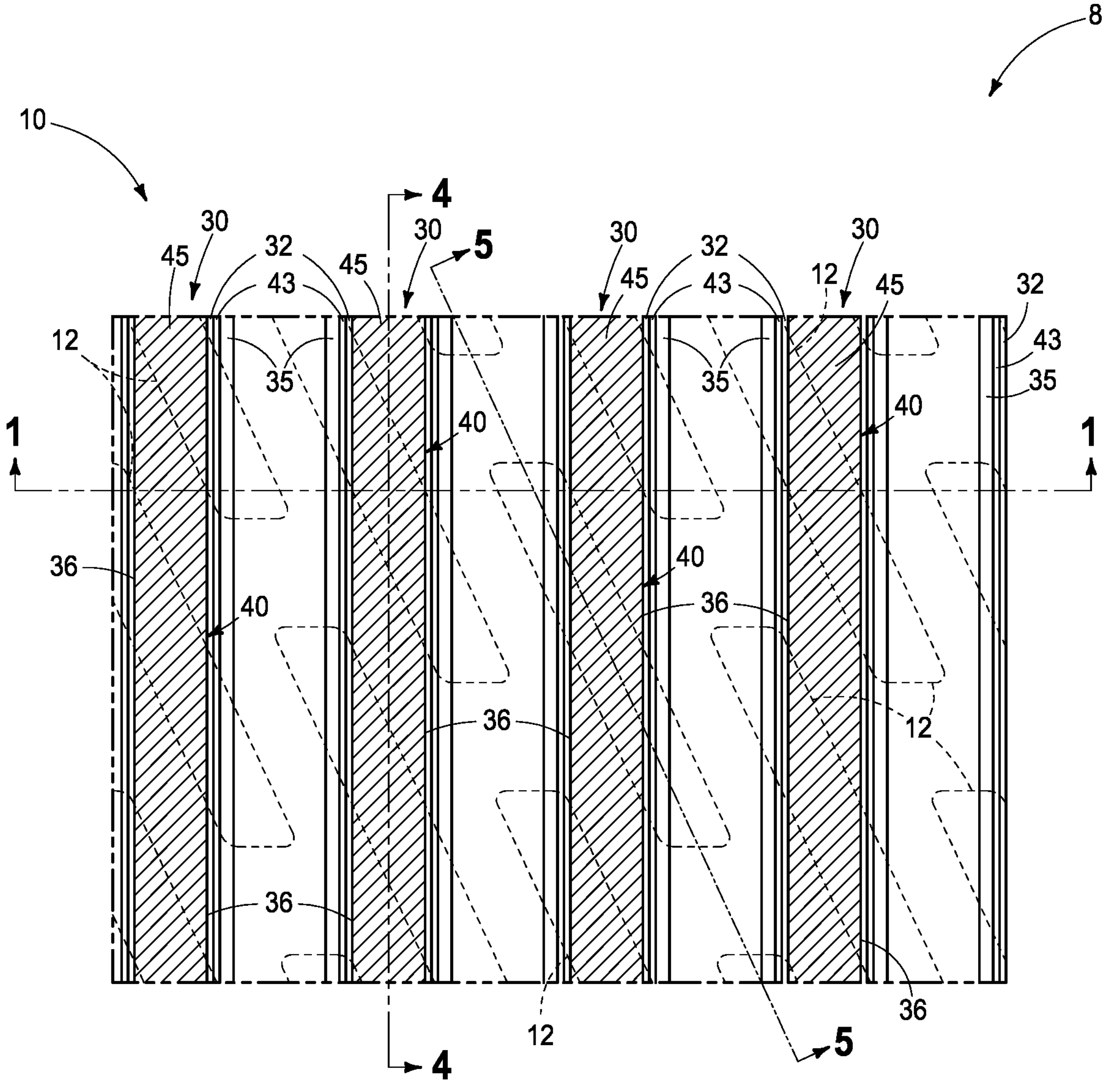

Embodiments of the invention encompass memory circuitry, such as DRAM, and methods used in forming memory circuitry, such as a DRAM. First example method embodiments are described with reference to FIGS. 1-18.

Referring to FIGS. 1-7, an example fragment of a substrate construction 8 comprising an array or array area 10 has been fabricated relative to a base substrate 11. Substrate 11 may comprise any one or more of conductive/conductor/conducting, semiconductive/semiconductor/semiconducting, and insulative/insulator/insulating (i.e., electrically herein) materials. Materials may be aside, elevationally inward, or elevationally outward of the FIGS. 1-7-depicted materials. For example, other partially or wholly fabricated components of integrated circuitry may be provided somewhere above, about, or within base substrate 11. Control and/or other peripheral circuitry for operating components within a memory array may also be fabricated and may or may not be wholly or partially within a memory array or sub-array. Further, multiple sub-arrays may also be fabricated and operated independently, in tandem, or otherwise relative one another. As used in this document, a "sub-array" may also be considered as an array.

Base substrate 11 comprises semiconductive material 12 (e.g., appropriately and variously doped monocrystalline and/or polycrystalline silicon, Ge, SiGe, GaAs, and/or other existing or future-developed semiconductive material), trench isolation regions 14 (e.g., silicon nitride atop silicon dioxide), and active area regions 16 comprising suitably and variously-doped semiconductive material 12. Construction 8 comprises transistors 25 individually comprising one source/drain region 24 and another source/drain region 26, a channel region 27 between the one and the another source/drain regions, and a conductive gate 22 (e.g., conductively-doped semiconductor material and/or metal material, including for example elemental W, Ru, and/or Mo) operatively proximate channel region 27 (e.g., a gate insulator 20 being between the conductive gate 22 and channel region 27, for example silicon dioxide and/or silicon nitride). Transistors 25 are shown as being recessed access devices, with example construction 8 showing such recessed access devices grouped in individual pairs of such devices. Individual recessed access devices/transistors 25 include a buried access line construction 18, for example that is within a trench 19 in semiconductive material 12. Constructions 18 comprise conductive gate 22. Gate insulator 20 is along sidewalls 21 and a base 23 of individual trenches 19 between conductive gate 22 and semiconductive material 12. Insulator material 17 (e.g., silicon dioxide and/or silicon nitride) is within trenches 19 above materials 20 and 22. One source/drain region 24 and another source/drain region 26 are in upper portions of semiconductive material 12 on opposing sides of individual trenches 19 (e.g., regions 24, 26 being laterally-outward of and higher than access line constructions 18). Each of source/drain regions 24, 26 has at least a part thereof having a conductivity-increasing dopant therein that is of maximum concentration of such conductivity-increasing dopant within the respective source/drain region 24, 26, for example to render such part to be conductive (e.g., having a maximum dopant concentration of at least $10^{19}$ atoms/$cm^3$). Accordingly, all or only a part of each source/drain region 24, 26 may have such maximum concentration of conductivity-increasing dopant. Source/drain regions 24 and/or 26 may include other doped regions (not shown), for example halo regions, LDD regions, etc.

In the example embodiment, one of the source/drain regions (e.g., another source/drain region 26) of the pair of source/drain regions in individual of the pairs of transistors 25 is laterally between conductive gates 22 and is shared by the pair of devices 25. Others of the source/drain regions (e.g., one source/drain region 24) of the pair of source/drain regions are not shared by the pair of transistors 25. Thus, in the example embodiment, each active area region 16 comprises two transistors 25 (e.g., one pair of transistors 25), with each sharing a central source/drain region 26.

Example channel region 27 is in semiconductive material 12 below pair of source/drain regions 24, 26 along trench sidewalls 21 and around trench base 23. Channel region 27 may be undoped or may be suitably doped with a conductivity-increasing dopant likely of the opposite conductivity-type of the dopant in source/drain regions 24, 26. When suitable voltage is applied to gate material 22 of an access line construction 18, a conductive channel forms (e.g., along a channel current-flow line/path 29 [FIG. 5]) within channel region 27 proximate gate insulator 20 such that current is capable of flowing between a pair of source/drain regions 24 and 26 under the access line construction 18 within an individual active area region 16. Stippling is diagrammatically shown to indicate primary conductivity-modifying dopant concentration (regardless of type), with denser stippling indicating greater dopant concentration and lighter stippling indicating lower dopant concentration. Conductivity-modifying dopant may be, and would likely be, in other portions of material 12 as shown. Only two different stippling densities are shown in material 12 for convenience, and additional dopant concentrations may be used, and constant dopant concentration is not required in any region.

Digitline structures 30 have been formed and are individually directly electrically coupled to another source/drain regions 26 of multiple of transistors 25. Digitline structures 30 individually comprise a conductive digitline 40 (e.g., comprising conductive metal material 45) that is directly electrically coupled to individual another source/drain regions 26 through individual conductive vias 34 that have insulative material 90 (e.g., silicon nitride and/or silicon dioxide) there-between). Digitline structures 30 comprise an insulator material 28 thereatop (having a top 33). In one embodiment and as shown, digitline structures 30 individually comprise an anisotropically-etched insulative sidewall spacer 31 on each side thereof (e.g., individually having a top 55 that is elevationally-coincident with top 33 of insulator material 28). Example spacer 31 comprises a laterally-inner insulative spacer 32 (e.g., silicon dioxide) and a laterally-outer insulative spacer 43 (e.g., carbon-doped silicon dioxide).

First insulating material 35 (e.g., stoichiometric silicon nitride) has been formed directly above tops 33 of insulator material 28 and laterally-over longitudinal sides 36 of digitline structures 30 (and over spacers 31 when present). First insulating material 35 also covers across one source/drain regions 24 laterally-between immediately-adjacent digitline structures 30.

Figure 8:
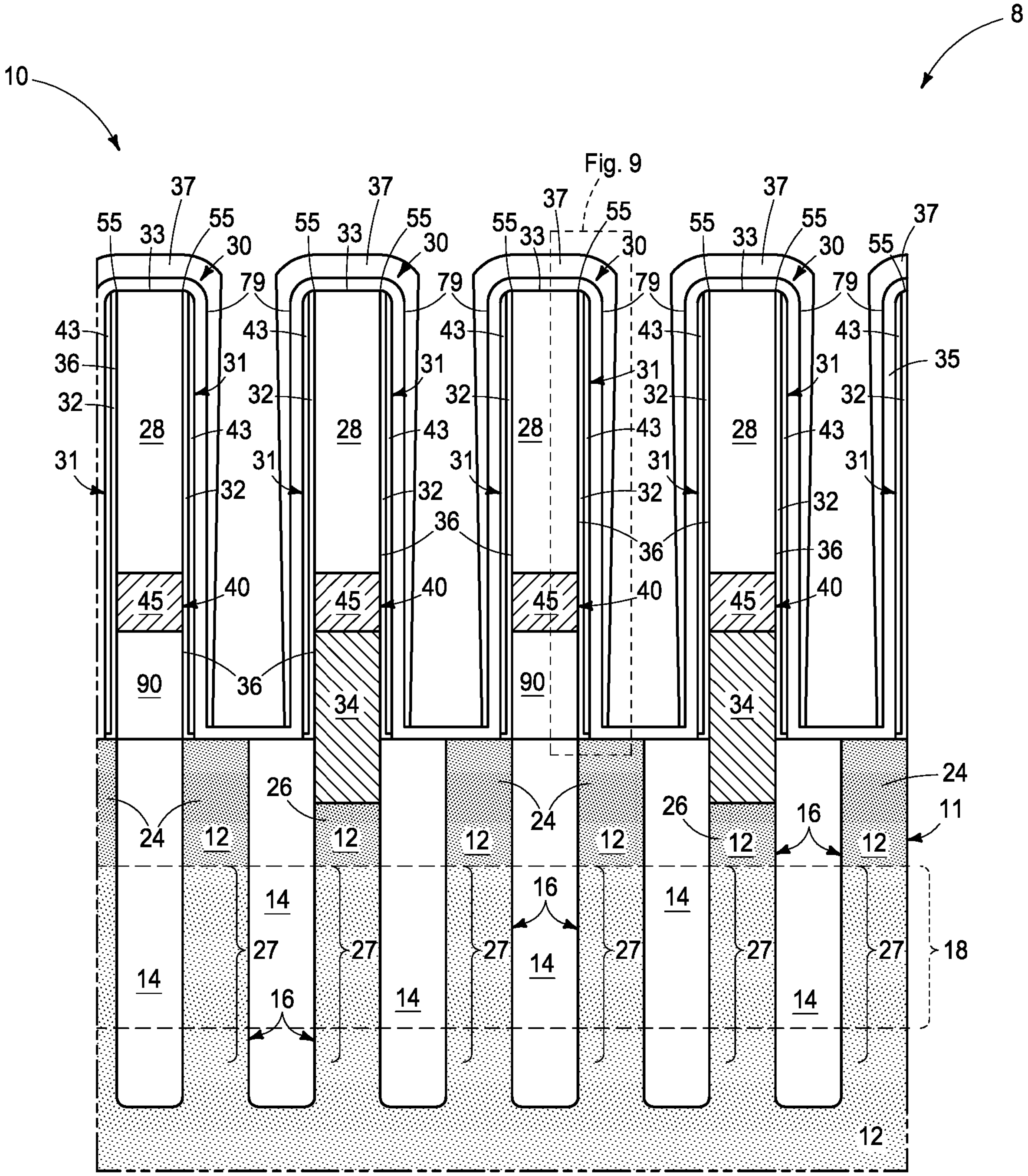
Figure 9:
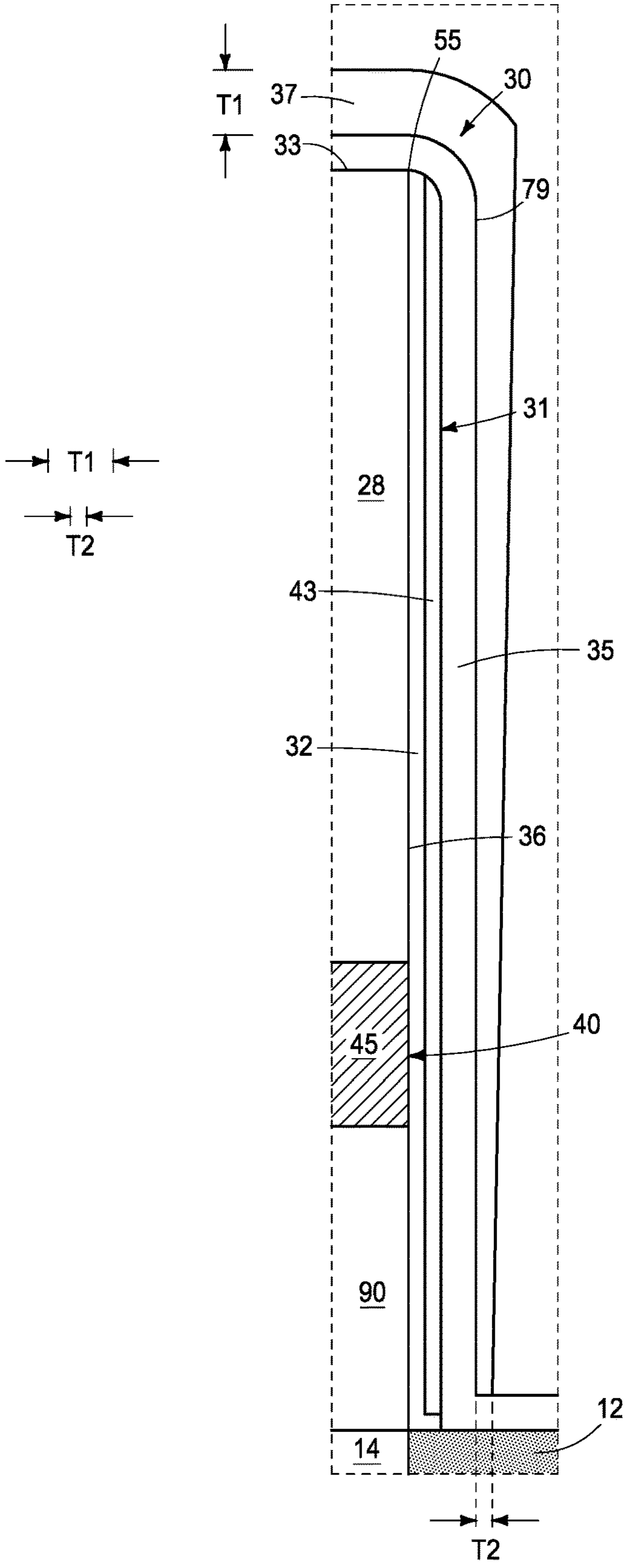

Referring to FIGS. 8 and 9, second insulating material 37 (e.g., carbon-doped silicon nitride, stoichiometric silicon carbonitride, boron-doped silicon nitride, and/or phosphorus-doped silicon nitride, silicon dioxide, carbon-doped silicon dioxide, boron-doped silicon dioxide, phosphorus-doped silicon dioxide, and/or silicon oxynitride) has been formed over first insulating material 35. Second insulating material 37 has a maximum vertical thickness directly above the digitline structures 30 (e.g., T1) that is greater than its minimum lateral thickness over longitudinal sides 36 of digitline structures 30 (e.g., T2). Second insulating material 37 may cover across one source/drain regions 24 laterally-between immediately-adjacent digitline structures 30 (not shown) or may not so cover (as shown). Regardless, in one embodiment and as shown, second insulating material 37 tapers toward its bottom end.

In one embodiment, first and second insulating materials 35, 37 are directly against one another and have an interface 79 there-between, with first and second insulating materials 35, 37 being of the same composition relative one another at interface 79. In another embodiment, materials 35, 37 are directly against one another, with first and second insulating materials 35, 37 being of different compositions relative one another at interface 79. Regardless, in one embodiment, second insulating material 37 comprises a nitride and in one such embodiment the nitride is doped with at least one of boron, phosphorus, and carbon. In one embodiment when comprising a nitride, the nitride comprises at least one of boron nitride, silicon nitride, silicon oxynitride, and aluminum-poor aluminum nitride ("poor" meaning stoichiometrically such that the aluminum nitride is insulative as opposed to semiconductive). In one embodiment, second insulating material 37 comprises an oxide and in one such embodiment the oxide is doped with at least one of boron, phosphorus, and carbon. In one embodiment when comprising an oxide, the oxide comprises at least one of silicon dioxide, germanium oxide, and an insulative metal oxide. In one embodiment when comprising an insulative metal oxide, such comprises multiple different metals.

Interfaces herein may be continuous or may be discontinuous at some place(s) there-along. Interfaces will be continuous when the immediately-adjacent materials thereof are of different compositions relative one another. Interfaces may or may not be continuous when the immediately-adjacent materials thereof are of the same composition relative one another. For example, separate-in-time formed immediately-adjacent materials if of the same composition relative one another may nevertheless have a perceptible interface in a finished construction. Some of that interface may effectively disappear (i.e., not be perceptible) and some may remain perceptible whereby that interface is discontinuous in one or more locations longitudinally-there-along (e.g., as may occur by welding of the same-composition materials together due to subsequent heating during manufacture).

Figure 10:
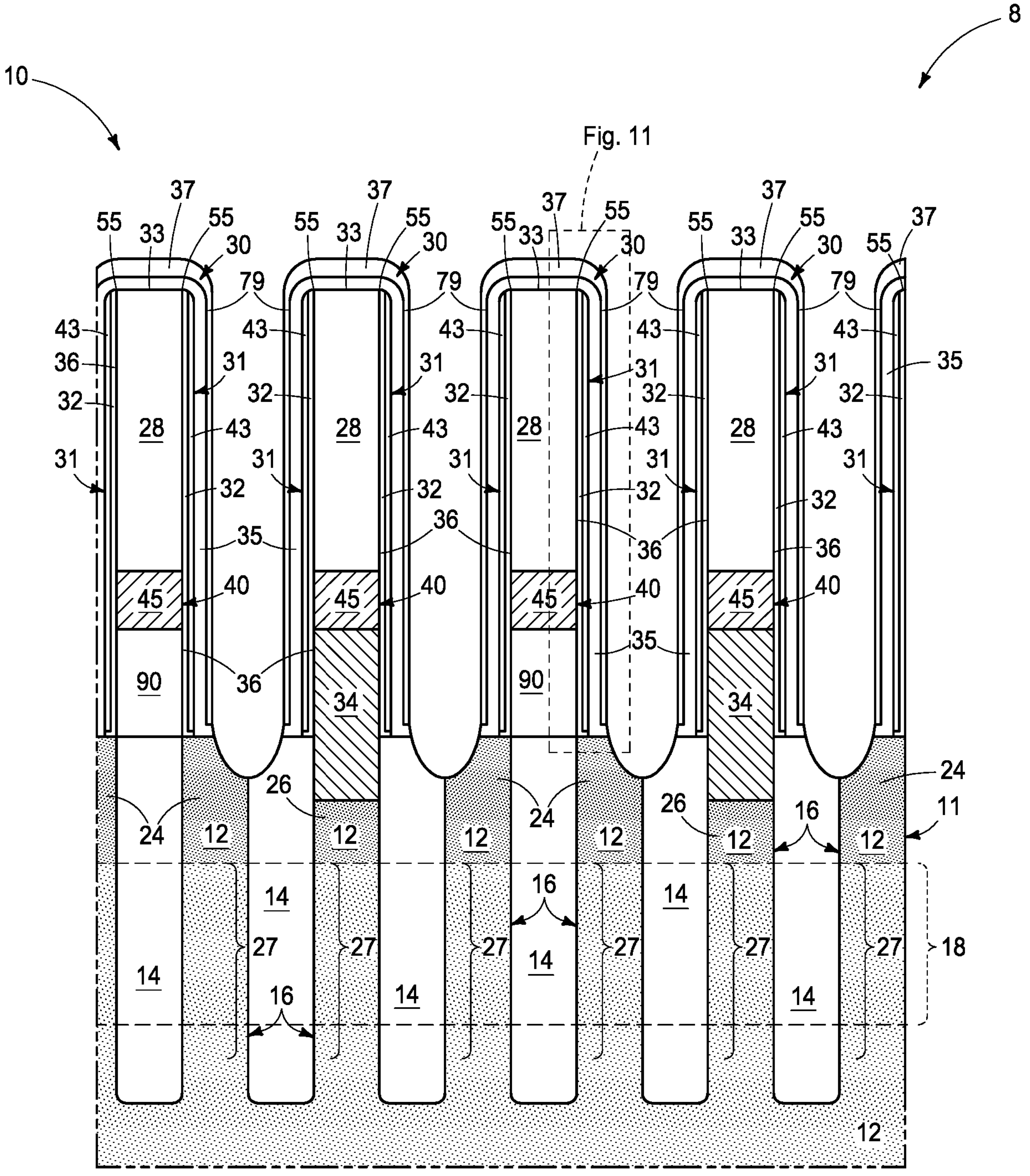
Figure 11:
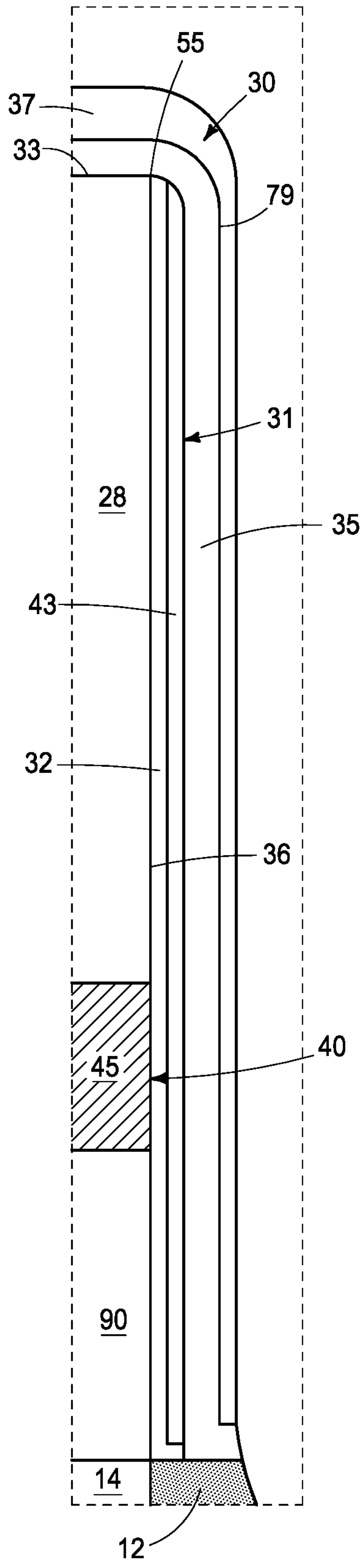
Figure 12:
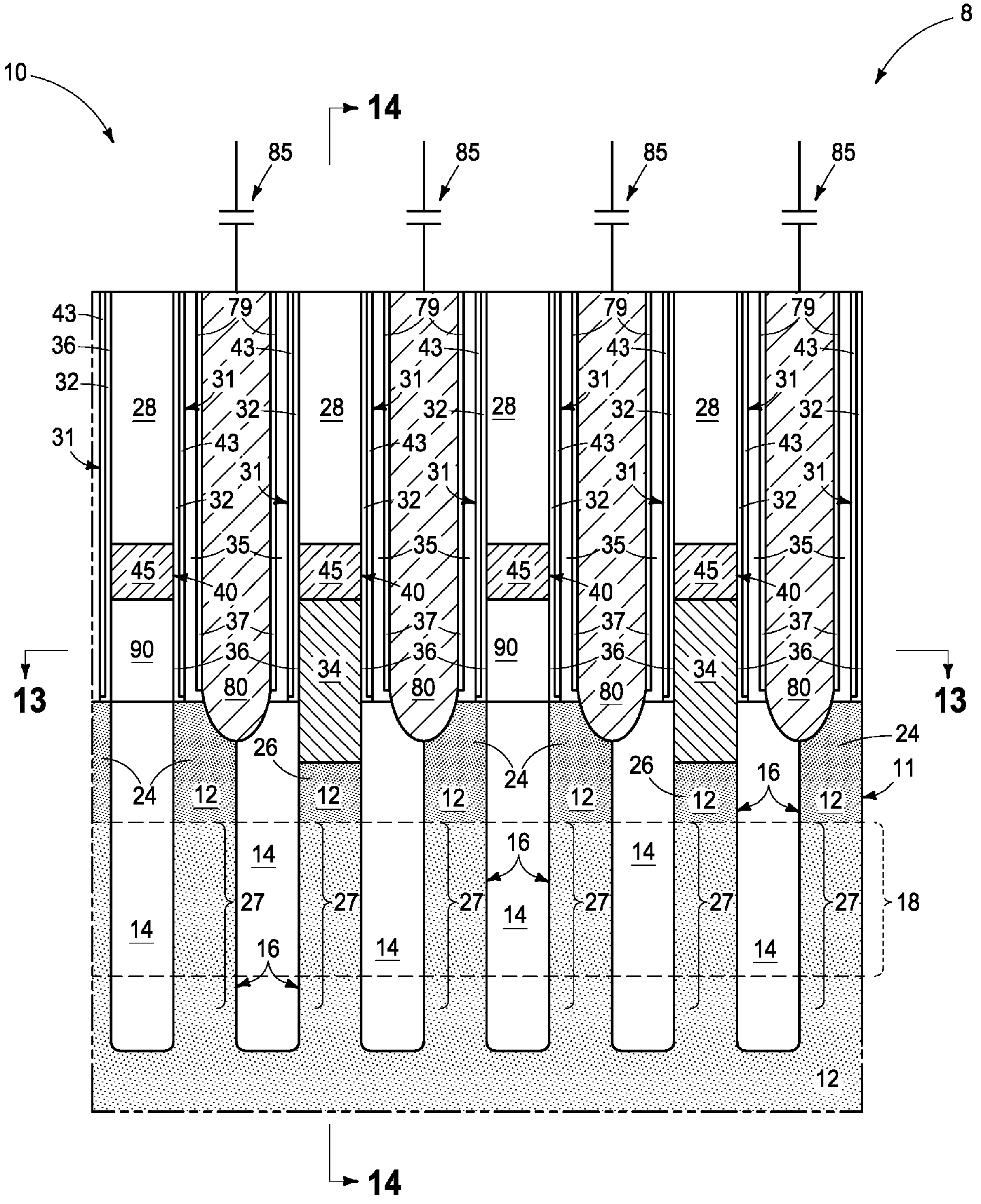
Figure 13:
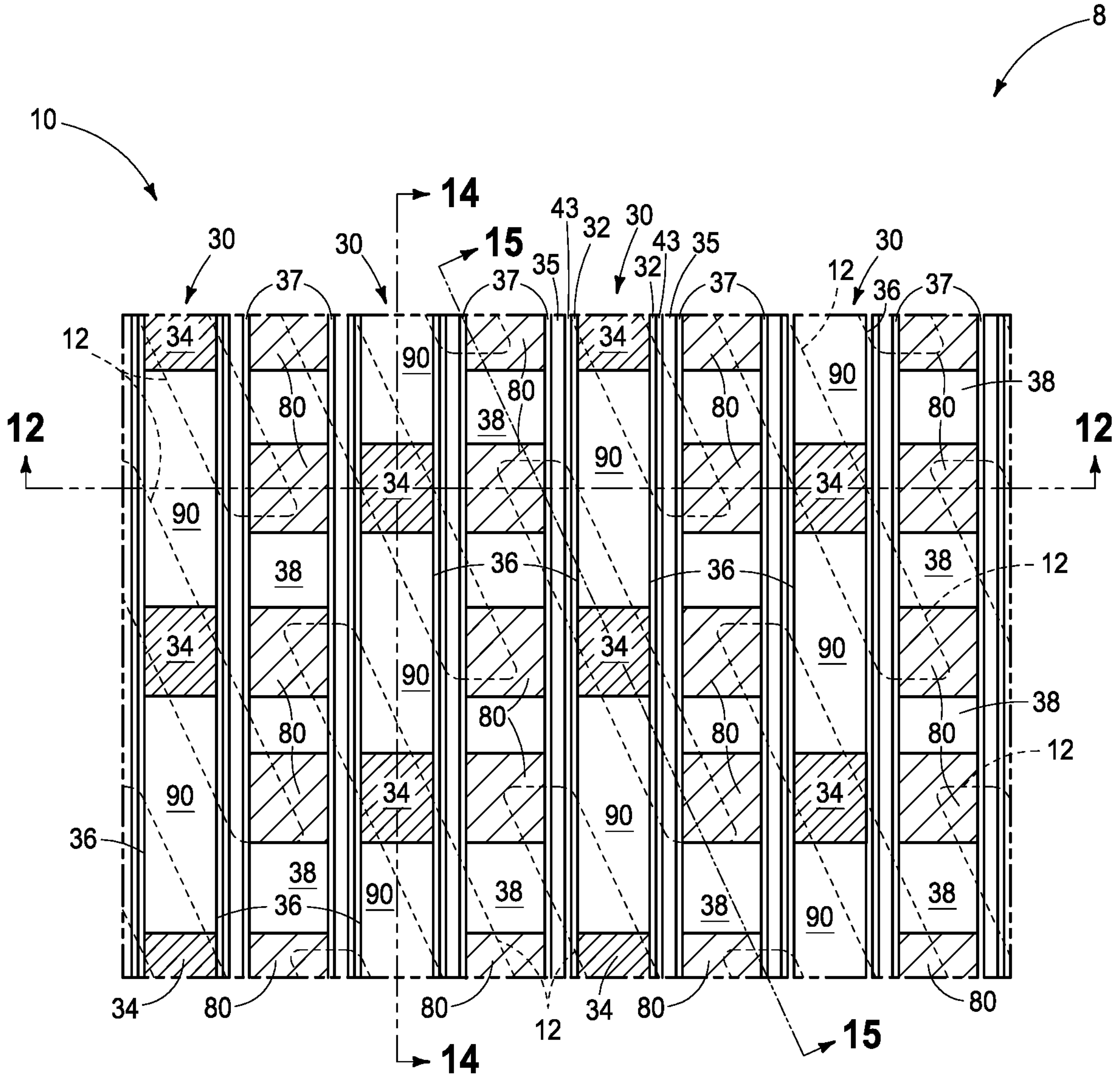
Figure 14:
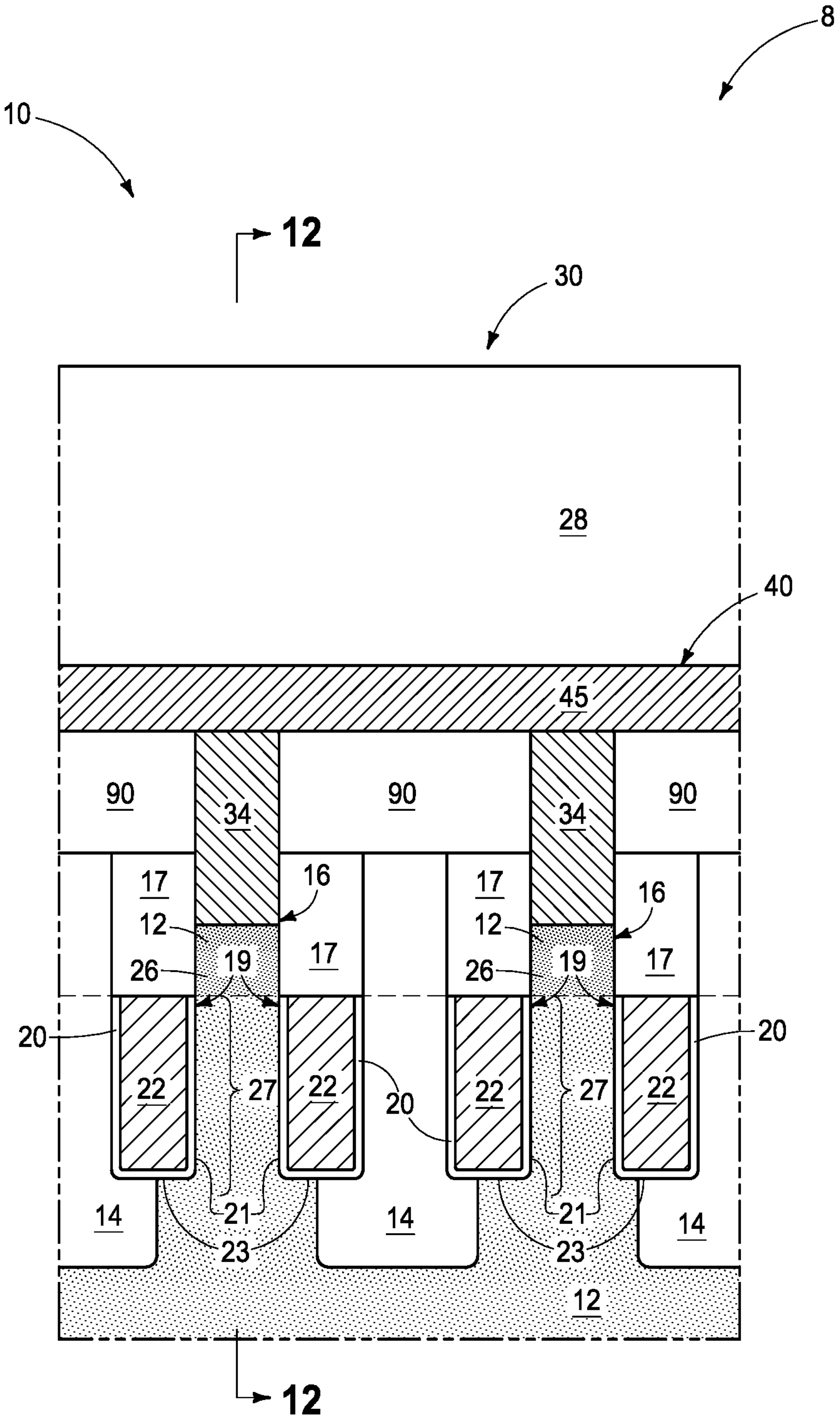
Figure 15:
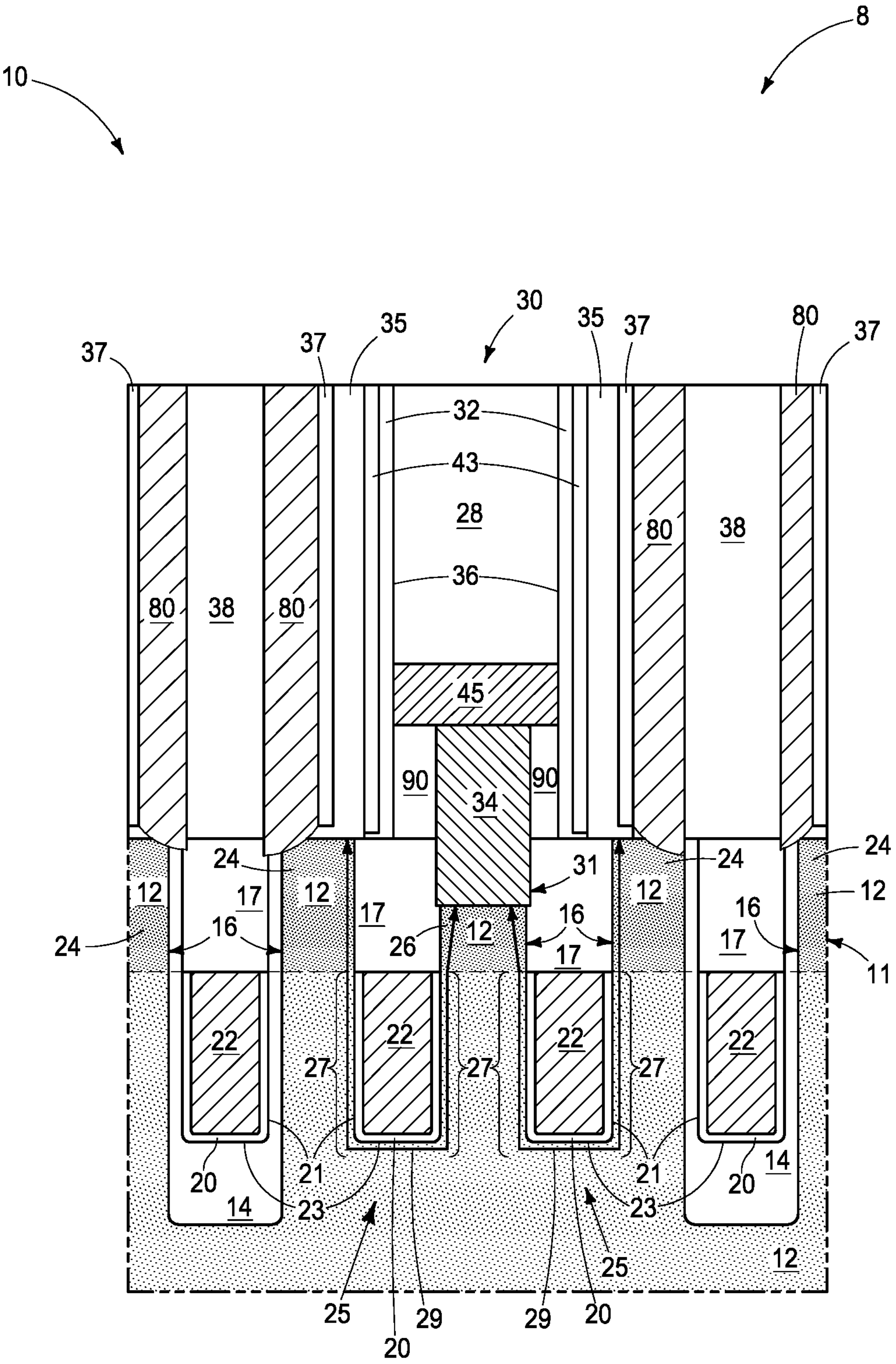

Referring to FIGS. 10 and 11, etching has been conducted through first insulating material 35 to expose one source/drain regions 24. If second insulating material 37 is covering across one source/drain regions 24 laterally-between immediately-adjacent digitline structures 30 (not shown), such etching would also first be conducted through such second insulating material 37. In one embodiment and as shown, where second insulating material 37 tapers toward its bottom end, such taper has been removed whereby it will not remain in a finished-circuitry construction comprising the memory circuitry. Regardless, in one embodiment, second insulating material 37 remains laterally-over sidewalls of conductive digitlines 40 in the finished-circuitry construction and in another embodiment does not.

Referring to FIGS. 12-15, storage elements 85 (e.g., capacitors) have been formed and that are individually electrically coupled (e.g., directly electrically coupled) to individual one source/drain regions 24. For example, and by way of example only, conductive vias 80 have been formed in insulative material 38 (e.g., comprising silicon nitride and/or silicon dioxide) and storage elements 85 are directly electrically coupled thereto.

Figure 16:
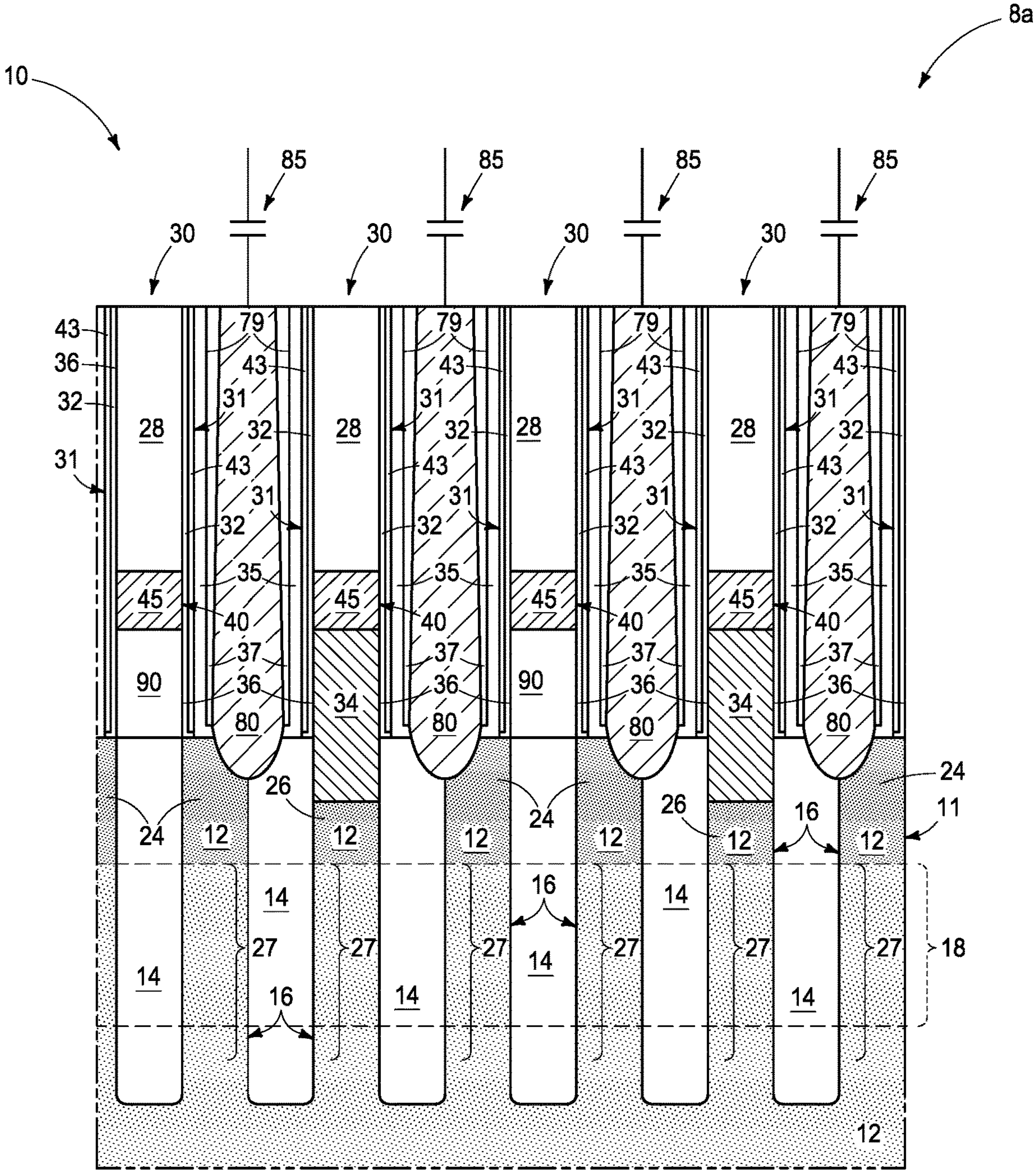

In one embodiment, where second insulating material 37 tapers toward its bottom end, such taper remains in a finished-circuitry construction comprising the memory circuitry, for example as shown with respect to an alternate embodiment construction 8*a* in FIG. 16. Like numerals from the above-described embodiments have been used where appropriate, with some construction differences being indicated with a suffix “a” or with different numerals. Such taper may be reduced in the finished-circuitry construction from what it was originally. Any other attribute(s) or aspect(s) as shown and/or described herein with respect to other embodiments may be used.

Figure 17:
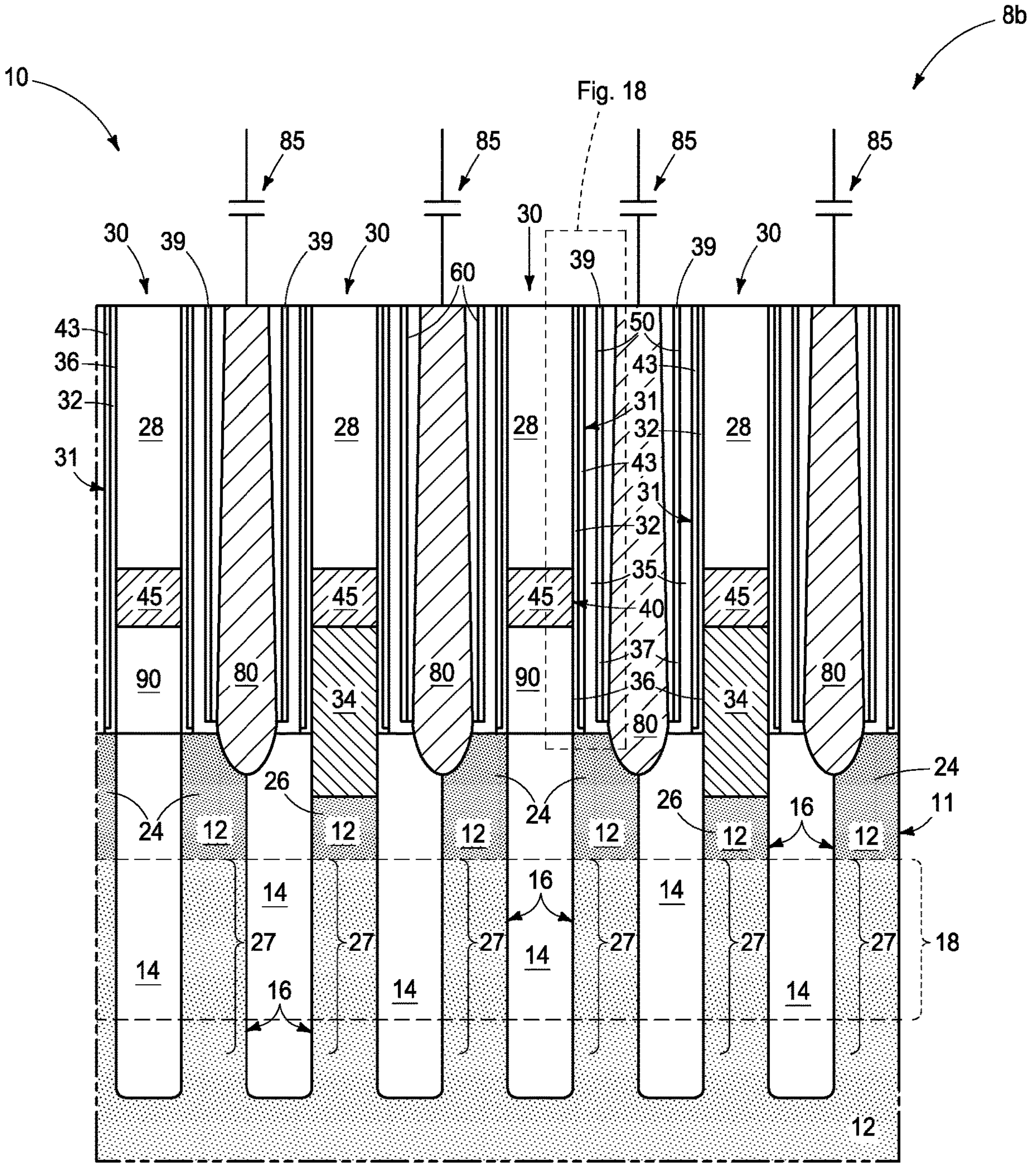
Figure 18:
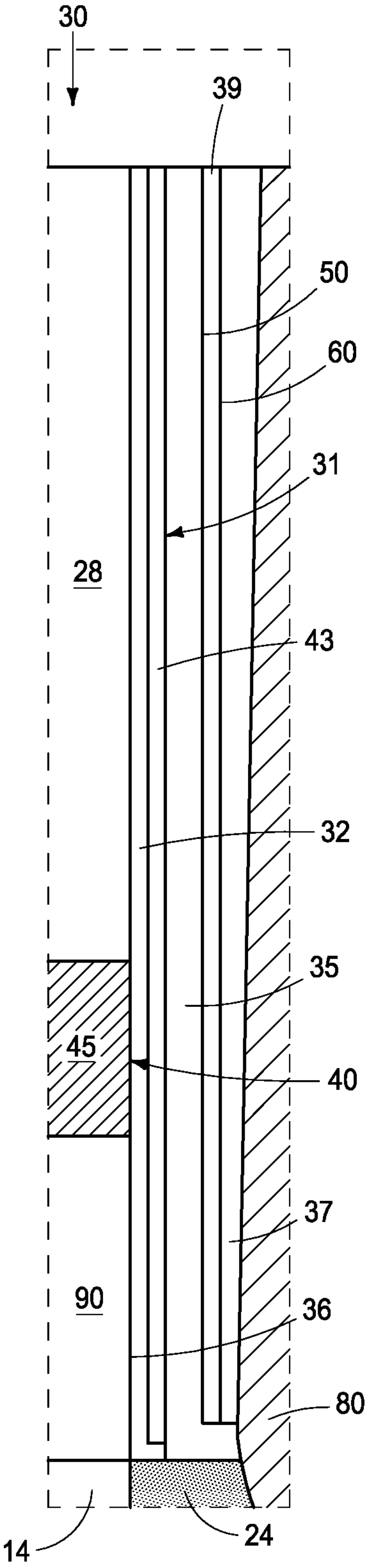

In one embodiment, an insulative material is formed over and directly against first insulating material 35 prior to forming second insulating material 37, for example as shown and described with reference to a construction 8*b* in FIGS. 17 and 18. Like numerals from the above-described embodiments have been used where appropriate, with some construction differences being indicated with a suffix “b” or with different numerals. Such show forming insulative material 39 over and directly against first insulating material 35, with first insulating material 35 and insulative material 39 having a first interface 50 there-between. Second insulating material 37 has been formed over and directly against insulative material 39, with insulative material 39 and second insulating material 37 having a second interface 60 there-between. Insulative material 39 may be of the same composition or of different composition from that of either first insulating material 35 and/or second insulating material 37. In one embodiment, insulative material 39 and second insulating material 37 are of the same composition relative one another at second interface 60 and in one embodiment are of different compositions relative one another at second interface 60. Regardless, in one embodiment second insulating material 37 tapers toward its bottom end and in another embodiment does not taper toward its bottom end (e.g., in an intermediate and/or finished-circuitry construction). Any other attribute(s) or aspect(s) as shown and/or described herein with respect to other embodiments may be used.

Forming second insulating material 37 to have a maximum vertical thickness directly above digitline structures 30 that is greater than its minimum lateral thickness over longitudinal sides 36 thereof may result, although not require, thinner or no second insulating material 37 being formed across one source/drain regions 24 laterally-between immediately-adjacent digitline structures 30. Such may result, although not require, an easier or more consistent etching to exposing one source/drain regions 24 for electrical coupling to storage elements 85.

Alternate embodiment constructions may result from method embodiments described above, or otherwise. Regardless, embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments.

In one embodiment, memory circuitry (e.g., 8) comprises transistors 25 individually comprising one source/drain region (e.g., 24) and another source/drain region (e.g., 26). A channel region (e.g., 27) is between the one and the another source/drain regions. A conductive gate (e.g., 22) is operatively proximate the channel region. Digitline structures (e.g., 30) are individually directly electrically coupled to the another source/drain regions of multiple of the transistors. The digitline structures individually comprise a conductive digitline (e.g., 40) and an insulator material 28 thereatop, with the insulator material having a top (e.g., 33). First insulating material (e.g., 35) is directly above the tops of the insulator material and laterally-over longitudinal sides (e.g., 36) of the digitline structures. Second insulating material (e.g., 37) is over and directly against the first insulating material. The second insulating material has a maximum vertical thickness directly above the digitline structures (e.g., T1) that is greater than its minimum lateral thickness (e.g., T2) over the longitudinal sides of the digitline structures. Storage elements (e.g., 85) are individually electrically coupled to individual of the one source/drain regions.

In one embodiment, the digitline structures individually comprise an insulative sidewall spacer (e.g., 31) on each side thereof and over which the first insulating material is formed. In one such embodiment, the insulative sidewall spacers have tops (e.g., 55) that are elevationally-coincident with the top of the insulator material. In one embodiment, the second insulating material is laterally-over sidewalls of the conductive digitlines (as shown) and in another embodiment is not (not shown).

Any other attribute(s) or aspect(s) as shown and/or described herein with respect to other embodiments may be used.

In one embodiment, memory circuitry (e.g., 8) comprises transistors 25 individually comprising one source/drain region (e.g., 24) and another source/drain region (e.g., 26). A channel region (e.g., 27) is between the one and the another source/drain regions. A conductive gate (e.g., 22) is operatively proximate the channel region. Digitline structures (e.g., 30) are individually directly electrically coupled to the another source/drain regions of multiple of the transistors. The digitline structures individually comprise a conductive digitline (e.g., 40) and an insulator material 28 thereatop, with the insulator material having a top (e.g., 33). First insulating material (e.g., 35) is directly above the tops of the insulator material and laterally-over longitudinal sides (e.g., 36) of the digitline structures. Insulative material (e.g., 35) is over and directly against the first insulating material.

A first interface (e.g., 50) is between the first insulating material and the insulative material. Second insulating material (e.g., 37) is over and directly against the insulative material. A second interface (e.g., 60) is between the insulative material and the second insulating material. The second insulating material has a maximum vertical thickness (e.g., T1) directly above the digitline structures that is greater than its minimum lateral thickness (e.g., T2) over the longitudinal sides of the digitline structures. Storage elements (e.g., 85) are individually electrically coupled to individual of the one source/drain regions. Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be conductive metal material and/or conductively-doped semiconductive/semiconductor/semiconducting material. "Metal material" is any one or combination of an elemental metal, any mixture or alloy of two or more elemental metals, and any one or more metallic compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming memory circuitry comprises forming transistors individually comprising one source/drain region and another source/drain region. A channel region is between the one and the another source/drain regions. A conductive gate is operatively proximate the channel region. Digitline structures are formed that are individually directly electrically coupled to the another source/drain regions of multiple of the transistors. The digitline structures individually comprise a conductive digitline and an insulator material thereatop. The insulator material has a top. First insulating material is formed directly above the tops of the insulator material and laterally-over longitudinal sides of the digitline structures and covers across the one source/drain regions laterally-between immediately-adjacent of the digitline structures. Second insulating material is formed over the first insulating material. The second insulating material has a maximum vertical thickness directly above the digitline structures that is greater than its minimum lateral thickness over the longitudinal sides of the digitline structures. The first insulating material is etched through to expose the one source/drain regions. Storage elements are formed that are individually electrically coupled to individual of the one source/drain regions.

In some embodiments, memory circuitry comprises transistors individually comprising one source/drain region and another source/drain region. A channel region is between the one and the another source/drain regions. A conductive gate is operatively proximate the channel region. Digitline structures are individually directly electrically coupled to the another source/drain regions of multiple of the transistors. The digitline structures individually comprise a conductive digitline and an insulator material thereatop. The insulator material has a top. First insulating material is directly above the tops of the insulator material and laterally-over longitudinal sides of the digitline structures. Second insulating material is over and directly against the first insulating material. The second insulating material has a maximum vertical thickness directly above the digitline structures that is greater than its minimum lateral thickness over the longitudinal sides of the digitline structures. Storage elements are individually electrically coupled to individual of the one source/drain regions.

In some embodiments, memory circuitry comprises transistors individually comprising one source/drain region and another source/drain region. A channel region is between the one and the another source/drain regions. A conductive gate is operatively proximate the channel region. Digitline structures are individually directly electrically coupled to the another source/drain regions of multiple of the transistors. The digitline structures individually comprise a conductive digitline and an insulator material thereatop. The insulator material has a top. First insulating material is directly above the tops of the insulator material and laterally-over longitudinal sides of the digitline structures. Insulative material is over and directly against the first insulating material. A first interface is between the first insulating material and the insulative material. Second insulating material is over and directly against the insulative material. A second interface is between the insulative material and the second insulating material. The second insulating material has a maximum vertical thickness directly above the digitline structures that is greater than its minimum lateral thickness over the longitudinal sides of the digitline structures. Storage elements are individually electrically coupled to individual of the one source/drain regions.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming memory circuitry, comprising:

forming transistors individually comprising:

one source/drain region and another source/drain region;

a channel region between the one and the another source/drain regions; and a conductive gate operatively proximate the channel region;

forming digitline structures that are individually directly electrically coupled to the another source/drain regions of multiple of the transistors, the digitline structures individually comprising a conductive digitline and an insulator material thereatop, the insulator material having a top;

forming first insulating material directly above the tops of the insulator material and laterally-over longitudinal sides of the digitline structures and covering across the one source/drain regions laterally-between immediately-adjacent of the digitline structures;

forming second insulating material over the first insulating material, the second insulating material having a maximum vertical thickness directly above the digitline structures that is greater than its minimum lateral thickness over the longitudinal sides of the digitline structures;

etching through the first insulating material to expose the one source/drain regions; and forming storage elements that are individually electrically coupled to individual of the one source/drain regions.

2. The method of claim 1 wherein the digitline structures individually comprise an anisotropically-etched insulative sidewall spacer on each side thereof and over which the first insulating material is formed.

3. The method of claim 2 wherein the anisotropically-etched insulative sidewall spacers have tops that are elevationally-coincident with the top of the insulator material.

4. The method of claim 1 wherein the second insulating material tapers toward its bottom end.

5. The method of claim 4 wherein the taper remains in a finished-circuitry construction comprising the memory circuitry.

6. The method of claim 4 comprising removing the taper such that it does not remain in a finished-circuitry construction comprising the memory circuitry.

7. The method of claim 1 wherein the first and second insulating materials are directly against one another and have an interface there-between, the first and second insulating materials being of the same composition relative one another at the interface.

8. The method of claim 1 wherein the first and second insulating materials are directly against one another and have an interface there-between, the first and second insulating materials being of different compositions relative one another at the interface.

9. The method of claim 1 wherein the second insulating material comprises a nitride.

10. The method of claim 9 wherein the nitride is doped with at least one of boron, phosphorus, and carbon.

11. The method of claim 9 wherein the nitride comprises at least one of boron nitride, silicon nitride, silicon oxynitride, and aluminum-poor aluminum nitride.

12. The method of claim 1 wherein the second insulating material comprises an oxide.

13. The method of claim 12 wherein the oxide is doped with at least one of boron, phosphorus, and carbon.

14. The method of claim 12 wherein the oxide comprises at least one of silicon dioxide, germanium oxide, and an insulative metal oxide.

15. The method of claim 14 wherein the oxide comprises the insulative metal oxide and which comprises multiple different metals.

16. The method of claim 1 comprising forming insulative material over and directly against the first insulating material, the first insulating material and the insulative material having a first interface there-between, the second insulating material being formed over and directly against insulative material, the insulative material and the second insulating material having a second interface there-between.

17. The method of claim 16 wherein the insulative material and the second insulating material are of the same composition relative one another at the second interface.

18. The method of claim 16 wherein the insulative material and the second insulating material are of different compositions relative one another at the second interface.

* * * * *